United States Patent
Galan et al.

(10) Patent No.: US 12,395,140 B2
(45) Date of Patent: Aug. 19, 2025

(54) NON-RETURN TO ZERO (NRZ) AMPLIFIER SYSTEM

(71) Applicant: NORTHROP GRUMMAN SYSTEMS CORPORATION, Falls Church, VA (US)

(72) Inventors: Elias J. Galan, Baltimore, MD (US); Andrew Hostetler Miklich, Columbia, MD (US); Micah John Atman Stoutimore, Kensington, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 181 days.

(21) Appl. No.: 18/360,488

(22) Filed: Jul. 27, 2023

(65) Prior Publication Data

US 2025/0038723 A1   Jan. 30, 2025

(51) Int. Cl.
*H03F 19/00* (2006.01)
*G06N 10/00* (2022.01)
*H03K 19/195* (2006.01)
*H10N 60/12* (2023.01)

(52) U.S. Cl.
CPC ............ *H03F 19/00* (2013.01); *G06N 10/00* (2019.01); *H03K 19/195* (2013.01); *H10N 60/12* (2023.02)

(58) Field of Classification Search
CPC ...... H03F 19/00; G06N 10/00; H03K 19/195; H10N 60/12
USPC ....... 326/3; 505/170; 330/56, 250, 310, 302; 327/527
See application file for complete search history.

(56) References Cited

U.S. PATENT DOCUMENTS

| | | | |
|---|---|---|---|
| 5,436,451 | A | 7/1995 | Silver et al. |
| 5,963,351 | A | 10/1999 | Kaplounenko et al. |
| 6,157,329 | A | 12/2000 | Lee et al. |
| 6,242,939 | B1 | 6/2001 | Nagasawa et al. |

(Continued)

FOREIGN PATENT DOCUMENTS

| | | |
|---|---|---|
| EP | 0467104 A2 | 1/1992 |
| EP | 0660126 A2 | 6/1995 |

(Continued)

OTHER PUBLICATIONS

Google search results on "optical cavity nanophotonic crystal" Sep. 29, 2015.

(Continued)

*Primary Examiner* — Arnold M Kinkead
(74) *Attorney, Agent, or Firm* — Tarolli, Sundheim, Covell & Tummino LLP

(57) ABSTRACT

One example includes an amplifier system. The system includes an input configured to receive an input pulse, a first input path coupled to the input and configured to provide the input pulse to a control node, and a second input path coupled to the input and comprising at least one delay element to provide a delayed version of the input pulse to the control node. The system also includes a first amplifier device comprising the control node and being configured to provide a control flux in response to the input pulse and in response to the delayed version of the input pulse. The system further includes a second amplifier device coupled to the first amplifier device, the second amplifier device being set to a flux state in response to the control flux to provide an output voltage.

19 Claims, 4 Drawing Sheets

(56) References Cited

U.S. PATENT DOCUMENTS

| | | |
|---|---|---|
| 6,653,962 B2 | 11/2003 | Gupta et al. |
| 6,815,708 B1 | 11/2004 | Iguchi et al. |
| 6,864,005 B2 | 3/2005 | Mossman |
| 7,227,480 B2 | 6/2007 | Furuta et al. |
| 7,598,897 B2 | 10/2009 | Kirichenko |
| 7,630,588 B2 | 12/2009 | Ouchi |
| 7,689,070 B2 | 3/2010 | Ouchi |
| 7,724,020 B2 | 5/2010 | Herr |
| 7,724,083 B2 | 5/2010 | Herr et al. |
| 7,772,871 B2 | 8/2010 | Herr et al. |
| 7,782,077 B2 | 8/2010 | Herr et al. |
| 7,786,748 B1 | 8/2010 | Herr |
| 7,889,992 B1 | 2/2011 | Divincenzo et al. |
| 8,188,901 B1 | 5/2012 | Inamdar et al. |
| 8,670,807 B2 | 3/2014 | Rose et al. |
| 8,849,075 B2 | 9/2014 | Painter et al. |
| 8,952,671 B2 | 2/2015 | Shimizu et al. |
| 9,312,878 B1 | 4/2016 | Inamdar et al. |
| 9,443,576 B1 | 9/2016 | Miller |
| 9,467,126 B1 | 10/2016 | Naaman et al. |
| 9,497,126 B2 | 11/2016 | Matsuhira |
| 9,595,970 B1 | 3/2017 | Reohr et al. |
| 9,613,699 B1 | 4/2017 | Reohr et al. |
| 9,779,803 B1 | 10/2017 | Konigsburg et al. |
| 9,853,645 B1 | 12/2017 | Mukhanov et al. |
| 9,876,505 B1 | 1/2018 | Dai et al. |
| 9,887,700 B2 | 2/2018 | Carmean et al. |
| 10,090,841 B1 | 10/2018 | Herr |
| 10,243,582 B1 | 3/2019 | Herr |
| 11,201,608 B2 * | 12/2021 | Galan ............ H10N 60/12 |
| 11,545,288 B2 | 1/2023 | Strand |
| 2001/0025012 A1 | 9/2001 | Tarutani et al. |
| 2004/0201099 A1 | 10/2004 | Herr |
| 2004/0201400 A1 | 10/2004 | Herr |
| 2005/0047245 A1 | 3/2005 | Furuta et al. |
| 2005/0078022 A1 | 4/2005 | Hirano et al. |
| 2005/0231196 A1 | 10/2005 | Tarutani et al. |
| 2006/0049891 A1 | 3/2006 | Crete |
| 2006/0085160 A1 | 4/2006 | Ouchi |
| 2006/0209413 A1 | 9/2006 | Kim et al. |
| 2006/0255987 A1 | 11/2006 | Nagasawa et al. |
| 2008/0049885 A1 | 2/2008 | Inamdar |
| 2008/0267557 A1 | 10/2008 | Wang et al. |
| 2008/0304038 A1 | 12/2008 | Ouchi |
| 2009/0002014 A1 | 1/2009 | Gupta et al. |
| 2009/0075825 A1 | 3/2009 | Rose et al. |
| 2009/0082209 A1 | 3/2009 | Bunyk et al. |
| 2010/0026537 A1 | 2/2010 | Kirichenko |
| 2012/0274494 A1 | 11/2012 | Kirichenko |
| 2013/0121633 A1 | 5/2013 | Painter et al. |
| 2013/0278283 A1 | 10/2013 | Berkley |
| 2015/0060650 A1 | 3/2015 | Park |
| 2015/0060756 A1 | 3/2015 | Park |
| 2015/0092465 A1 | 4/2015 | Herr et al. |
| 2015/0094207 A1 | 4/2015 | Herr et al. |
| 2015/0349780 A1 | 12/2015 | Naaman et al. |
| 2016/0013791 A1 | 1/2016 | Herr et al. |
| 2016/0079968 A1 | 3/2016 | Strand et al. |
| 2016/0164505 A1 | 6/2016 | Naaman et al. |
| 2017/0017742 A1 | 1/2017 | Oberg et al. |
| 2018/0145664 A1 | 5/2018 | Herr et al. |
| 2019/0131944 A1 | 5/2019 | Naaman et al. |
| 2022/0326319 A1 * | 10/2022 | Knee ............ G01R 33/0358 |

FOREIGN PATENT DOCUMENTS

| | | |
|---|---|---|
| EP | 1213774 B1 | 12/2010 |
| JP | 2013058998 A | 3/2013 |
| WO | 98/08307 A1 | 2/1998 |
| WO | 2005/093649 A1 | 10/2005 |
| WO | 2008/050864 A1 | 5/2008 |
| WO | 2009/023969 A1 | 2/2009 |
| WO | 2010/028183 A2 | 3/2010 |
| WO | 2011/032825 A1 | 3/2011 |
| WO | 2014/028302 A2 | 2/2014 |
| WO | 2017/204977 A1 | 11/2017 |
| WO | 2018/044563 A1 | 3/2018 |

OTHER PUBLICATIONS

CST AG Nanophotonics and integrated optics, "Photonic Crystal Cavities" (2013).

Cicak et al: "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 1, 2009 (Jun. 1, 2009), pp. 948-952, XP011262430, ISSN: 1051-8223.

Mukhanov O A et al: "Development of Energy-efficient Cryogenic Optical (ECO) data link", 2013 IEEE 14th International Superconductive Electronics Conference (ISEC), IEEE, Jul. 7, 2013 (Jul. 7, 2013), pp. 1-3, XP032485120, DOI: 10.1109/ISEC.2013.6604276.

Painter: Optomechanical crystals Photonics Conference (IPC), 2012 IEEE, IEEE, Sep. 23, 2012 (Sep. 23, 2012), p. 546, XP032269201, DOI: 10.1109/IPCON.2012.6358735 ISBN: 978-1-4577-0731-5.

Sun et al: "A superhigh-frequency optoelectromechanical system based on a slotted photonic crystal cavity", Applied Physics Letters, American Institute of Physics, US, vol. 101, No. 22. Nov. 26, 2012 (Nov. 26, 2012), pp. 221116-221116, XP012168118, ISSN: 0003-6951, DOI: 10.1063/1.4769045.

Winger et al.: "A chip-scale integrated cavity-electro-optomechanics platform", Optics Express, vol. 19, No. 25, Nov. 22, 2011 (Nov. 22, 2011), pp. 24905-24921, XP002732657.

André, et al. : "A Coherent All-Electrical Interface Between Polar Molecules and Mesoscopic Superconducting Resonators"; Nature Physics, vol. 2, No. 9, Aug. 27, 2006, pp. 636-642; XP055174009, ISSN: 1745-2473; DOI: 10.1038/nphys386.

Teufel, et al.: "Circuit Cavity Electromechanics in the Strong-Coupling Regime", LETTER, Nature, vol. 471, Mar. 10, 2011, pp. 204-208.

Sillanpää, et al.: "Coherent Quantum State Storage and Transfer Between Two Phase Qubits via a Resonant Cavity", National Institute of Standards and Technology, 325 Broadway, Boulder, CO 80305, USA, Sep. 14, 2007, pp. 1-17.

Safavi-Naeini, et al.: "Proposal for an Optomechanical Traveling Wave Phonon-Photon Translator", New Journal of Physics 13 (2011) 013017 (30pp), Received Oct. 1, 2010, Published Jan. 13, 2011, Online at http://www.njp.org, pp. 1-30.

Regal, et al.: "From Cavity Electromechanics to Cavity Optomechanics", 22nd International Conference on Atomic Physics, Journal of Physics: Conference Series 264 (2011) 012025, pp. 1-8.

O'Connell, et al.: "Quantum Ground State and Single-Phonon Control of a Mechanical Resonator", Nature, Articles, vol. 464, Apr. 1, 2010, pp. 697-703.

Lin, et al.: "Coherent Mixing of Mechanical Excitations in Nano-Optomechanical Structures", Laboratory of Applied Physics, California Institute of Technology, Pasadena, CA 91125, USA, Aug. 7, 2009, pp. 1-27.

Kimble: "The Quantum Internet", Norman Bridge Laboratory of Physics 12-33, Jun. 25, 2006, pp. 1-15.

Hossein-Zadeh, et al.: "An Optomechanical Oscillator on a Silicon Chip", IEEE Journal of Selected Topics in Quantum Electronics, vol. 16, No. 1, Jan./Feb. 2010, pp. 276-287.

Eichenfield, et al.: "Optomechanical Crystals", California Institute of Technology, Pasadena, CA 91125, USA, Jun. 6, 2009, pp. 1-16.

DiCarlo, et al.: "Demonstration of Two-Qubit Algorithms with a Superconducting Quantum Processor", Departments of Physics and Applied Physics, Yale University, New Haven, CT 06511, USA, May 1, 2009, pp. 1-6 & Supplemental Material pp. 1-3.

Aoki, et al.: "Observation of Strong Coupling Between One Atom and a Monolithic Microresonator", Norman Bridge Laboratory of Physics 12-33, California Institute of Technology, Pasadena, CA 91125, USA, Sep. 4, 2006, pp. 1-12.

Stannigel, et al., "Opto-Mechanical Transducers for Long-Distance Quantum Communication", Jun. 22, 2010, DOI: 10.1103/PhysRevLett. 105.220501.

(56) References Cited

OTHER PUBLICATIONS

Tao, et al., "A Novel Transducer for Photon Energy Detection Via Near-Field Cavity Optomechanics", in Solid-State Sensors, Actuators and Microsystems (Transducers & Eurosensors XXVII), 2013 Transducers & Eurosensors XXVII: The 17th International Conference on , vol., no., pp. 1511-1514, 16-20 (2013) DOI: 10.1109/Transducers.2013.6627068.

Tallur, et al., "Rayleigh Scattering Boosted Multi-GHz Displacement Sensitivity in Whispering Gallery Opto-Mechanical Resonators", Opt. Express 21, 27780-27788 (2013).

Aspelmeyer, et al., "Cavity Optomechanics", Rev. Mod. Phys., vol. 86, No. 4, pp. 1391-1452 (2013), DOI: 10.113/RevModPhys.86.1391.

Teufel, et al. , "Prospects for Cooling Nanomechanical Motion by Coupling to a Superconducting Microwave Resonator", New Journal of Physicans, vol. 10, No. 9, pp. 095002 (2008), DOI: 10.1088/1367-2630/10/9/095002.

Favero, et al., "Optomechanics of Deformable Optical Cavities", Nature Photonics, vol. 3, No. 4, pp. 201-205 (2009), DOI: 10.1038/nphoton.2009.42.

Bochman, et al., "Nanomechanical Coupling between Microwave and Optical Photons", Nature Physics, vol. 9, No. 11, pp. 712-716 (2013), DOI: 10.1038/nphys2748.

Herr, et al.: "Ultra-Low-Power Superconductor Logic"; Journal of Applied Physics 109, 103903 (2011); Published Online: May 2011; https://doi.org/10.1063/1.3585849.

Herr: "A High-Efficiency Superconductor Distributed Amplifier"; Published Jan. 21, 2010 ~ IOP Publishing Ltd; Superconductor Science and Technology, vol. 23, No. 2.

\* cited by examiner

NON-RETURN TO ZERO (NRZ) AMPLIFIER SYSTEM

GOVERNMENT INTEREST

This invention was made with U.S. Government support. The U.S. Government has certain rights in this invention.

TECHNICAL FIELD

This disclosure relates generally to superconducting classical computing systems, and more specifically to an NRZ amplifier system.

BACKGROUND

Superconducting digital technology has provided computing and/or communications resources that benefit from unprecedented high speed, low power dissipation, and low operating temperature. A reciprocal quantum logic (RQL) Superconducting classical computer systems typically implement very low amplitude voltage pulses, such as single flux quantum (SFQ) pulses. RQL computer systems typically operate in a cold-space environment (e.g., approximately at or less than 4 Kelvin), and can communicate and/or interface with classical room temperature computer systems. Substantially all computing systems require logic gates and latches to process data and perform a variety of logic functions, with RQL computer systems implementing the low amplitude voltage pulses and classical computer systems implementing slightly higher amplitude voltage signals that can be clocked to provide logic signals.

SUMMARY

One example includes an amplifier system. The system includes an input configured to receive an input pulse, a first input path coupled to the input and configured to provide the input pulse to a control node, and a second input path coupled to the input and comprising at least one delay element to provide a delayed version of the input pulse to the control node. The system also includes a first amplifier device comprising the control node and being configured to provide a control flux in response to the input pulse and in response to the delayed version of the input pulse. The system further includes a second amplifier device coupled to the first amplifier device, the second amplifier device being set to a flux state in response to the control flux to provide an output voltage.

Another example includes a method for providing an output voltage from an amplifier system. The method includes providing an input pulse to an input that is coupled to a first input path and a second input path. The first input path can be configured to provide the input pulse to a control node and the second input path comprising at least one delay element to provide a delayed version of the input pulse to the control node. The method also includes providing a first DC bias current to a first superconducting quantum interference device (SQUID). The first SQUID includes the control node and being configured to provide a control flux in response to the input pulse and in response to the delayed version of the input pulse. The method also includes providing a second DC bias current to a second SQUID. The second SQUID can be inductively coupled to the first SQUID to be set to a flux state in response to the control flux. The method further includes differentially measuring an output voltage across the second SQUID.

Another example includes an amplifier system. The system includes an input configured to receive a reciprocal quantum logic (RQL) input pulses. The system also includes a first input path coupled to the input and configured to provide the input pulse to a control node via an RQL clock signal. The system also includes a second input path coupled to the input and comprising at least one delay element to provide a delayed version of the RQL input pulse to the control node via the RQL clock signal. The system also includes a first superconducting quantum interference device (SQUID) comprising the control node and being configured to provide a control flux in response to the RQL input pulse and in response to the delayed version of the RQL input pulse. The system further includes a second SQUID inductively coupled to the first SQUID, the second SQUID being set to a flux state in response to the control flux to provide an output voltage.

DETAILED DESCRIPTION

This disclosure relates generally to superconducting classical computing systems, and more specifically to a non-return-to-zero (NRZ) amplifier system. As described herein, with respect to operation, the NRZ amplifier system can convert short, very low amplitude voltage pulses (e.g., as implemented in reciprocal quantum logic (RQL) computing applications) to longer duration, higher amplitude voltage signals. The NRZ amplifier system can include an input that is configured to receive an input pulse, and can include a first input path and a second input path that are each coupled to the input. As an example, the input pulse can be provided as a reciprocal quantum logic (RQL) input pulse. As described herein, the term RQL pulse (e.g., RQL input pulse) is defined as a pair of fluxons provided as a positive fluxon followed by a negative fluxon (e.g., at approximately 180° phase-difference, such as based on an RQL clock signal). Each of the first and second input paths can include Josephson transmission lines (JTLs), such that the second input path can included one or more delay elements, such that the input pulse can be provided to a control node via each of the first and second input paths at a phase-shift (e.g., 180°).

The control node can be part of a first amplifier device that is coupled to a second amplifier device. As an example, the first and second amplifier devices can be configured as superconducting quantum interference devices (SQUIDs) that can be activated to provide a flux. For example, the input pulse can be provided to the control node to initiate a control flux in the first amplifier device, such as based on triggering a Josephson junction, which can be inductively provided to the second amplifier device to generate a flux state (e.g., a persistent flux) in the second amplifier device. The second amplifier device can be biased via a DC bias current, such that the flux state can provide an output voltage across the second amplifier device. For example, the output voltage can be measured differentially.

Figure 1:
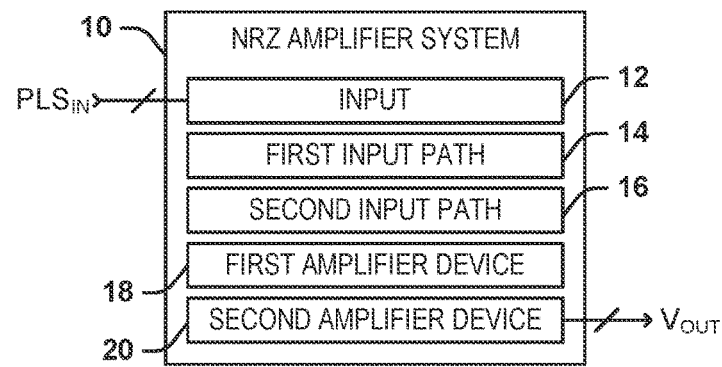
FIG. 1 illustrates an example of an NRZ amplifier system.

FIG. 1 illustrates an example of a NRZ amplifier system 10. The NRZ amplifier system 10 can be implemented, for example, to provide an interface between an RQL computing system and a classical computer system, such as across a cold-space barrier. In the example of FIG. 1, the NRZ amplifier system 10 can convert short, very low amplitude voltage pulses, demonstrated as an input pulse $PLS_{IN}$, to longer duration, higher amplitude voltage signals, demonstrated as an output voltage $V_{OUT}$.

The NRZ amplifier system 10 includes an input 12 that is configured to receive the input pulse $PLS_{IN}$. As an example, the input pulse $PLS_{IN}$ can be provided as a reciprocal quantum logic (RQL) input pulse pair that includes a positive fluxon followed by a negative fluxon (e.g., at approximately 180° phase-difference based on an RQL clock signal). The input 12 can correspond, for example, to a Josephson transmission line (JTL) that is configured to propagate the input pulse $PLS_{IN}$ via a clock signal (e.g., a multi-phase clock signal, such as an RQL clock signal that includes at least one of an in-phase component and a quadrature-phase component). The NRZ amplifier system 10 also includes a first input path 14 and a second input path 16 that are each coupled to the input 12, and are thus configured to propagate the input pulse $PLS_{IN}$. As an example, the second input path 16 can include at least one delay element to propagate the input pulse $PLS_{IN}$ at a delay relative to the first input path 14 (e.g., by 180° relative to the first input path 12). For example, the delay element(s) of the second input path 16 can include JTL stages configured to propagate the input pulse $PLS_{IN}$ on additional phases of the clock signal relative to the JTL stages associated with the first input path 14.

The NRZ amplifier system 10 also includes a first amplifier device 18 and a second amplifier device 20. As an example, the first and second amplifier devices 18 and 20 can be configured as superconducting quantum interference devices (SQUIDs) that are inductively coupled. The first amplifier device 18 can be coupled to the first and second input paths 14 and 16 via a control node, such that the first amplifier device 18 can be activated to provide a control flux in response to the input pulse $PLS_{IN}$ provided from at least one of the first and second input paths 14 and 16. The control flux can be provided (e.g., inductively) to the second amplifier device 20, such that the second amplifier device 20 can be configured to be set to a flux state in response to the control flux. The flux state can provide the output voltage $V_{OUT}$ across the second amplifier device 20. For example, the second amplifier device 20 can be biased via a DC bias current and can thus be measured based on a differential measurement across the second amplifier device 20.

As an example, the input pulse $PLS_{IN}$ provided to the first amplifier device 18 alternately from each of the first and second input paths 14 and 16 can maintain the control flux in the first amplifier device 18, and can thus maintain the output voltage $V_{OUT}$ across the second amplifier device 20. As a result, the NRZ amplifier system 10 can be configured to provide the output voltage $V_{OUT}$ as a substantially longer duration voltage signal corresponding to each of the very short duration voltage pulses of the input pulse $PLS_{IN}$. Accordingly, the NRZ amplifier system 10 can convert the input pulse $PLS_{IN}$, as implemented in and/or provided from a superconducting computer system, to the output voltage $V_{OUT}$ as a longer duration voltage signal, such as implemented in and/or provided to a conventional computer system. As another example, and as described in greater detail herein, the input pulse $PLS_{IN}$ can correspond to an RQL pulse, such that the positive fluxon of the RQL pulse provided from the second input path 56 can combine with a negative fluxon of the RQL pulse provided from first input path 54, and vice versa with respect to a corresponding next pulse, to cancel each other at the control node to maintain the control flux at the first amplifier device 58. Therefore, the output voltage $V_{OUT}$ is maintained at the second amplifier device 20 to correspond to successive logic-high state input pulses $PLS_{IN}$ propagated to the input 52 being converted to successive logic-high state amplitudes of the output voltage $V_{OUT}$. Accordingly, the NRZ amplifier system 10 provides the output voltage $V_{OUT}$ in a non-return-to-zero manner in response to the input pulse $PLS_{IN}$.

Figure 2:
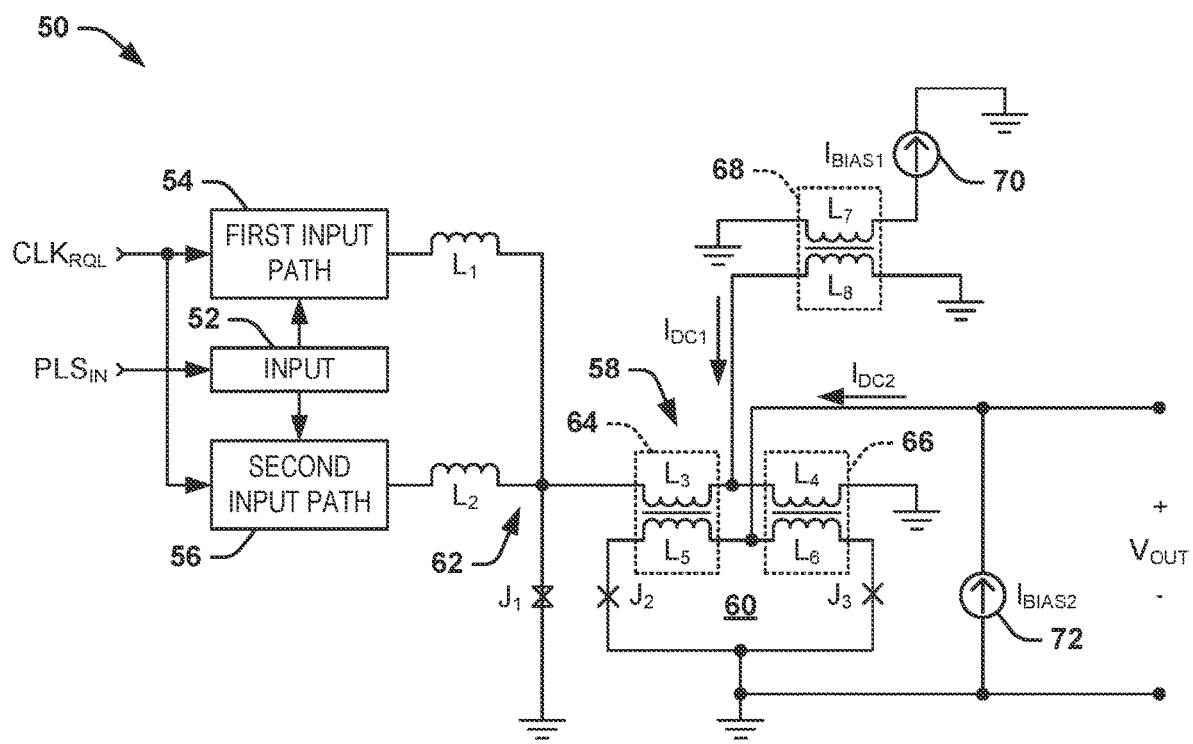
FIG. 2 illustrates an example of an NRZ amplifier circuit.

FIG. 2 illustrates an example of a NRZ amplifier circuit 50. The NRZ amplifier circuit 50 can be implemented, for example, to provide an interface between an RQL computing system and a classical room-temperature computer system, such as across a cold-space barrier. Similar to the NRZ amplifier system 10 in the example of FIG. 1, the NRZ amplifier circuit 50 can convert short, very low amplitude voltage pulses, demonstrated as an input pulse $PLS_{IN}$, to longer duration, higher amplitude voltage signals, demonstrated as an output voltage $V_{OUT}$.

The NRZ amplifier circuit 50 includes an input 52 that is configured to receive the input pulse $PLS_{IN}$. As an example, the input pulse $PLS_{IN}$ can be provided as an RQL input pulse that includes a positive fluxon followed by a negative fluxon (e.g., at approximately 180° phase-difference based on an RQL clock signal). The input 52 can correspond, for example, to a Josephson transmission line (JTL) that is configured to propagate the input pulse $PLS_{IN}$ via a clock signal $CLK_{RQL}$ (e.g., an RQL clock signal including at least one of an in-phase component and a quadrature-phase component). The NRZ amplifier circuit 50 also includes a first input path 54 and a second input path 56 that are each coupled to the input 52, and are thus configured to propagate the input pulse $PLS_{IN}$. As an example, the second input path 56 can include at least one delay element to propagate the input pulse $PLS_{IN}$ at a delay relative to the first input path 54 (e.g., by 180° relative to the first input path 52). For example, the delay element(s) of the second input path 56 can include JTL stages configured to propagate the input pulse $PLS_{IN}$ on additional phases of the clock signal relative to the JTL stages associated with the first input path 54.

Figure 3:
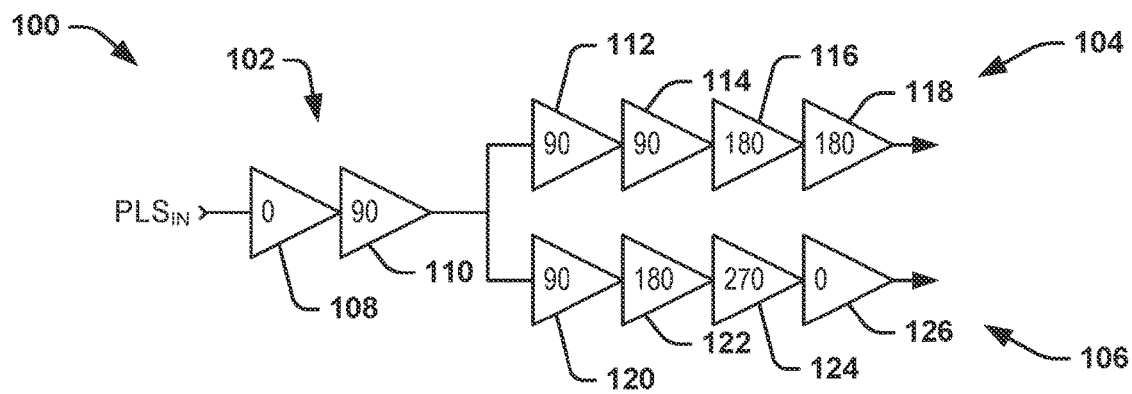
FIG. 3 illustrates an example diagram of input paths of an NRZ amplifier system.

FIG. 3 illustrates another example of an NRZ amplifier system 100. The NRZ amplifier system 100 includes an input 102, a first input path 104, and a second input path 106. The NRZ amplifier system 100 can correspond to a portion of the NRZ amplifier circuit 50 in the example of FIG. 2. For example, the input 102 can correspond to the inputs 12 and 52 in the respective examples of FIGS. 1 and 2, the first input path 104 can correspond to the first input paths 14 and 54 in the respective examples of FIGS. 1 and 2, and the second input path 106 can correspond to the second input paths 16 and 56 in the respective examples of FIGS. 1 and 2. Therefore, reference is to be made to the examples of FIGS. 1 and 2 in the following description of the examples of FIG. 3.

The input 102 includes a first JTL stage 108 and a second JTL stage 110. The first JTL stage 108 is demonstrated as being triggered from a 0° phase from a clock signal CLK (e.g., an RQL clock signal). The second JTL stage 110 is demonstrated as being triggered from a 90° phase from the clock signal CLK. Therefore, the input pulse $PLS_{IN}$ propagates through the first JTL stage 108 at the 0° phase of the clock signal CLK and through the second JTL stage 110 at the 90° phase of the clock signal CLK.

The first input path 104 includes a first JTL stage 112 and a second JTL stage 114 that are demonstrated as being triggered by the 90° phase from the clock signal CLK, and further includes a third JTL stage 116 and a fourth JTL stage 118 that are demonstrated as being triggered by a 180° phase from the clock signal CLK. Therefore, the input pulse $PLS_{IN}$ propagates from the input 102 to the first input path 104, and through the first and second JTL stages 112 and 114 at the 90° phase of the clock signal CLK and through the third and fourth JTL stages 116 and 118 at the 180° phase of the clock signal CLK. The first input stage 104 includes redundant phase JTL stages for balance relative to the second input stage 106, and thus could include only two JTL stages that are clocked by the respective 90° and 180° phases of the clock signal CLK.

The second input path 106 includes a first JTL stage 120 that is demonstrated as being triggered by the 90° phase from the clock signal CLK and a second JTL stage 122 that is demonstrated as being triggered by the 180° phase from the clock signal CLK. The second input path 106 also includes a third JTL stage 124 that is demonstrated as being triggered by the 270° phase from the clock signal CLK and a fourth JTL stage 126 that is demonstrated as being triggered by the 0° phase from the clock signal CLK. Therefore, the input pulse $PLS_{IN}$ propagates from the input 102 to the second input path 106, and through the first JTL stage 120 at the 90° phase of the clock signal CLK, through the second JTL stage 122 at the 180° phase of the clock signal CLK, through the third JTL stage 124 at the 270° phase of the clock signal CLK, and through the fourth JTL stage 126 at the 0° phase of the clock signal CLK. Accordingly, the second input path 106 provides a phase-delay of the input pulse $PLS_{IN}$ relative to the first input path 104 by approximately 180°.

Referring back to the example of FIG. 2, the NRZ amplifier circuit 50 also includes a first amplifier device 58, demonstrated as a radio frequency (RF) SQUID, and a second amplifier device 60, demonstrated as a DC SQUID. The first amplifier device 58 includes a Josephson junction $J_1$ that is configured as a shunted Josephson junction coupled to a control node 62 to which the first and second input paths 54 and 56 are likewise coupled via respective inductors $L_1$ and $L_2$. The first amplifier device 58 also includes a primary inductors $L_3$ and $L_4$ that are inductively coupled to secondary inductors $L_5$ and $L_6$, such that the inductors $L_3$ and $L_5$ form a first transformer 64 and the inductors $L_4$ and $L_6$ form a second transformer 66. The first amplifier device 58 is provided a DC bias current $I_{DC1}$ via a transformer 68 formed by a primary inductor $L_7$ and a secondary inductor $L_8$. The primary inductor $L_7$ is coupled to a DC current source 70 that is configured to provide a DC bias source current $I_{BIAS1}$ to induce the DC bias current $I_{DC1}$ to the first amplifier device 58. Therefore, in response to the input pulse $PLS_{IN}$ being provided from the first input path 54 to the control node 62 (e.g., absent a negative fluxon concurrently provided from the second input path 56, as described in greater detail herein), the Josephson junction $J_1$ will trigger to provide the control flux in the first amplifier device 58.

The second amplifier device 60 includes a first and second Josephson junctions $J_2$ and $J_3$. The second amplifier device 60 also includes the secondary inductors $L_5$ and $L_6$. Therefore, the second amplifier device 60 is inductively coupled to the first amplifier device 58. The second amplifier device 60 is provided a DC bias current $I_{DC2}$ from a DC current source 72 that is configured to provide a DC bias source current $I_{BIAS2}$ that is arranged across the second amplifier device 60. Therefore, the control flux provided by the first amplifier device 58 induces a flux state in the second amplifier device 60 and triggers the Josephson junctions $J_2$ and $J_3$ to enter a voltage state. The voltage state of the Josephson junctions $J_2$ and $J_3$, and thus the flux state of the second amplifier device 60, thus provides an output voltage $V_{OUT}$ across the second amplifier device 60. For example, the output voltage $V_{OUT}$ can be measured differentially across the second amplifier device 60.

As described previously, the input pulse $PLS_{IN}$ can be provided as an RQL pulse that includes a positive fluxon and a negative fluxon that successively follows (e.g., by approximately 180°). Therefore, the positive fluxon of the RQL input pulse $PLS_{IN}$ can trigger the Josephson junction $J_1$ to activate the control flux in the first amplifier device 58. However, in response to the negative fluxon of the RQL input pulse $PLS_{IN}$ being provided from the second input path 56 to the control node 62 (e.g., absent a positive fluxon concurrently provided from the first input path 54, as described in greater detail herein), the Josephson junction $J_1$ will untrigger to deactivate the control flux in the first amplifier device 58. As a result, the second amplifier device 60 will switch from the flux state to a zero state. Accordingly, the output voltage $V_{OUT}$ decreases to zero amplitude.

As described previously, the second input path 56 can provide a phase-delay of the input pulse $PLS_{IN}$ of approximately 180°. Accordingly, for each RQL input pulse $PLS_{IN}$, when a negative fluxon is provided by the first input path 54 to the control node 62, a positive fluxon is concurrently provided by the second input path 56 to the control node 62. Similarly, a positive fluxon can be provided by the first input path 54 to the control node 62 for a next proceeding RQL input pulse concurrently with a negative fluxon provided by the second input path 56 to the control node 62. In either scenario, the positive and negative fluxons can thus combine at the control node 62 to cancel each other, thus maintaining the control flux in the first amplifier device 58, and likewise maintaining the flux state in the second amplifier device 60. Accordingly, successive RQL input pulses $PLS_{IN}$ corresponding to successive logic-high input states can be translated to the output voltage $V_{OUT}$ being maintained at a logic-high amplitude (e.g., 0.5 millivolts) corresponding to the successive logic-high states. In response to a transition to a logic-low state at the input 52, and thus no RQL input pulse $PLS_{IN}$ being provided, a negative fluxon is provided from the second input path 56 without a positive fluxon being provided from the first input path 54 to untrigger the Josephson junction $J_1$. Accordingly, the control flux is deactivated in the first amplifier device 58 to switch the second amplifier device 60 from the flux state to the zero state to deactivate the output voltage $V_{OUT}$.

While the NRZ amplifier circuit 50 is described as implementing RQL input pulses $PLS_{IN}$, it is to be understood that other ways of deactivating the NRZ amplifier circuit 50 can be implemented instead of a negative fluxon of an RQL input pulse $PLS_{IN}$. For example, the NRZ amplifier circuit 50 can implement other ways of removing the control flux from the first amplifier circuit 58, such as providing a dedicated negative fluxon or other dedicated deactivation circuitry, to facilitate operation of the NRZ amplifier circuit 50 absent RQL, such as in a rapid single flux quantum (RSFQ) operational environment (e.g., and based on implementing a timing reference alternative to the RQL clock signal).

Figure 4:
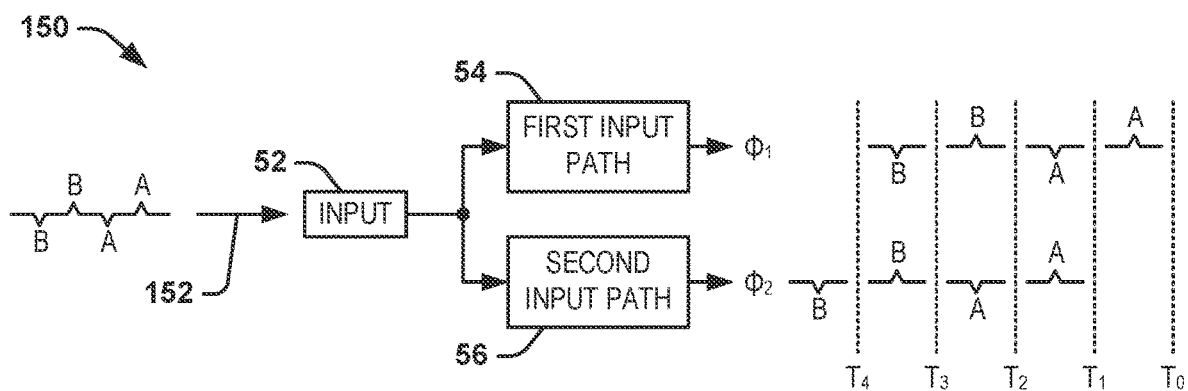
FIG. 4 illustrates an example diagram of input pulses being provided to the NRZ amplifier system.

FIG. 4 illustrates an example diagram 150 of input pulses $PLS_{IN}$ being provided to the NRZ amplifier system. The diagram 150 can correspond to operation of the NRZ amplifier circuit 50 in the example of FIG. 2. Therefore, reference is to be made to the examples of FIGS. 1-3 in the following description of the example of FIG. 4.

The diagram 150 demonstrates two consecutive RQL input pulses, demonstrated as "A" and "B", being provided to the input stage 52, such that the RQL input pulse "A" is provided first, followed by the RQL input pulse "B". In the example of FIG. 4, each of the first and second RQL pulses "A" and "B" include a positive fluxon followed by a negative fluxon, as indicated by the arrow 152. The RQL input pulses "A" and "B" are each provided to both the first input path 54 and the second input path 56. In the example of FIG. 4, the first input path 54 provides an output $\Phi_1$ corresponding to a data phase (e.g., a positive flux quantum or a negative flux quantum) associated with the RQL input pulses "A" and "B" at a given time, and the second input path 56 provides an output $\Phi_2$ corresponding to a data phase (e.g., a positive flux quantum or a negative flux quantum) associated with the RQL input pulses "A" and "B" at a given time phase-delayed from the output $\Phi_1$ (e.g., by approximately 180°). The outputs $\Phi_1$ and $\Phi_2$ are provided to the control node 62, as described previously in the example of FIG. 2.

Figure 5:
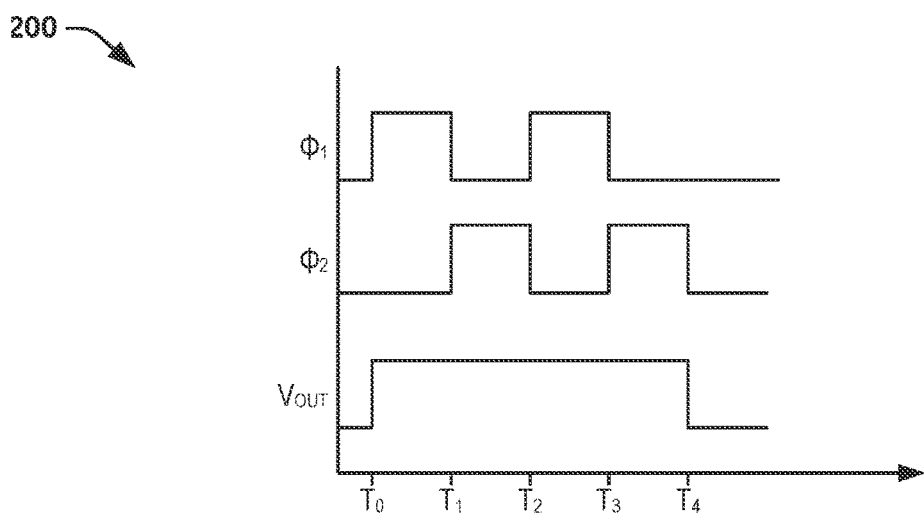
FIG. 5 illustrates an example of a timing diagram.

The diagram 150 also demonstrates the outputs $\Phi_1$ and $\Phi_2$ of the first and second input paths 54 and 56, respectively, at each of separate times. The outputs are also demonstrated with reference to the example of FIG. 5. FIG. 5 demonstrates an example of a timing diagram 200 corresponding to the outputs $\Phi_1$ and $\Phi_2$, as well as the output voltage $V_{OUT}$. The example of FIG. 5 demonstrates the outputs of the example of FIG. 4. Therefore, reference is to be made to the examples of FIGS. 1-4 in the description of the example of FIG. 5. In the following descriptions of the examples of FIGS. 4 and 5, it is to be understood that an additional RQL input pulse does not follow the RQL input pulse "B" in a next successive clock phase.

At a time $T_0$, a positive fluxon of the RQL input pulse "A" is output from the first input path 54 to the node 62, and nothing is output from the second input path 56 to the node 62. Therefore, in the example of FIG. 5, the data phase $\Phi_1$ is demonstrated as logic-high and the data phase $\Phi_2$ is demonstrated as logic-low at the time $T_0$. As a result, the positive fluxon of the RQL input pulse "A" triggers the Josephson junction $J_1$ to activate the control flux of the first amplifier device 58, which induces the flux state in the second amplifier device 60. As a result, the output voltage $V_{OUT}$ increases in amplitude from the logic-low amplitude (e.g., zero volts) to the logic-high amplitude.

At a time $T_1$, a negative fluxon of the RQL input pulse "A" is output from the first input path 54. However, because the second input path 56 is phase-delayed from the first input path 54 by approximately 180°, and because the negative fluxon follows the positive fluxon in a given RQL input pulse by approximately 180°, the second input path 56 provides the positive fluxon of the RQL input pulse "A". Therefore, in the example of FIG. 5, the data phase $\Phi_1$ is demonstrated as logic-low and the data phase $\Phi_2$ is demonstrated as logic-high at the time $T_1$. The positive and negative fluxons provided to the control node 62 at the time $T_1$, and thus the opposing data phases $\Phi_1$ and $\Phi_2$, combine to cancel each other. As a result, the control flux of the first amplifier device 58 is maintained to maintain flux state in the second amplifier device 60. As a result, the output voltage $V_{OUT}$ is maintained at the logic-high amplitude to correspond to the logic-high state at the time $T_1$.

At a time $T_2$, a positive fluxon of the next RQL input pulse "B" is output from the first input path 54. However, because the second input path 56 is phase-delayed from the first input path 54 by approximately 180°, the second input path 56 provides the negative fluxon of the RQL input pulse "A". Therefore, in the example of FIG. 5, the data phase $\Phi_1$ is demonstrated as logic-high and the data phase $\Phi_2$ is demonstrated as logic-low at the time $T_2$. The positive and negative fluxons provided to the control node 62 at the time $T_2$, and thus the opposing data phases $\Phi_1$ and $\Phi_2$, combine to cancel each other. As a result, the control flux of the first amplifier device 58 is maintained to maintain flux state in the second amplifier device 60. As a result, the output voltage $V_{OUT}$ is maintained at the logic-high amplitude to correspond to the logic-high state at the time $T_2$.

At a time $T_3$, a negative fluxon of the RQL input pulse "B" is output from the first input path 54. However, because the second input path 56 is phase-delayed from the first input path 54 by approximately 180°, the second input path 56 provides the positive fluxon of the RQL input pulse "B". Therefore, in the example of FIG. 5, the data phase $\Phi_1$ is demonstrated as logic-low and the data phase $\Phi_2$ is demonstrated as logic-high at the time $T_3$. The positive and negative fluxons provided to the control node 62 at the time $T_3$, and thus the opposing data phases $\Phi_1$ and $\Phi_2$, combine to cancel each other. As a result, the control flux of the first amplifier device 58 is maintained to maintain flux state in the second amplifier device 60. As a result, the output voltage $V_{OUT}$ is maintained at the logic-high amplitude to correspond to the logic-high state at the time $T_3$.

At a time $T_4$, no fluxon is output from the first input path 54 because there is no subsequent RQL input pulse provided in a next clock phase after the RQL input pulse "B". However, because the second input path 56 is phase-delayed from the first input path 54 by approximately 180°, the second input path 56 provides the negative fluxon of the RQL input pulse "B". Therefore, in the example of FIG. 5, the data phase $\Phi_1$ is demonstrated as logic-low and the data phase $\Phi_2$ is demonstrated as logic-low at the time $T_4$. The negative fluxon provided to the control node 62 without a positive fluxon at the time $T_4$ thus untriggers the Josephson junction $J_1$. Therefore, the control flux in the first amplifier device 58 is ceased, resulting in the second amplifier device 60 switching from the flux state to the zero state (e.g., the Josephson junctions $J_2$ and $J_3$ return to the zero phase state from the voltage state). As a result, the output voltage $V_{OUT}$ decreases from the logic-high amplitude to the logic-low amplitude corresponding to the logic-low state at the time $T_4$.

Figure 6:
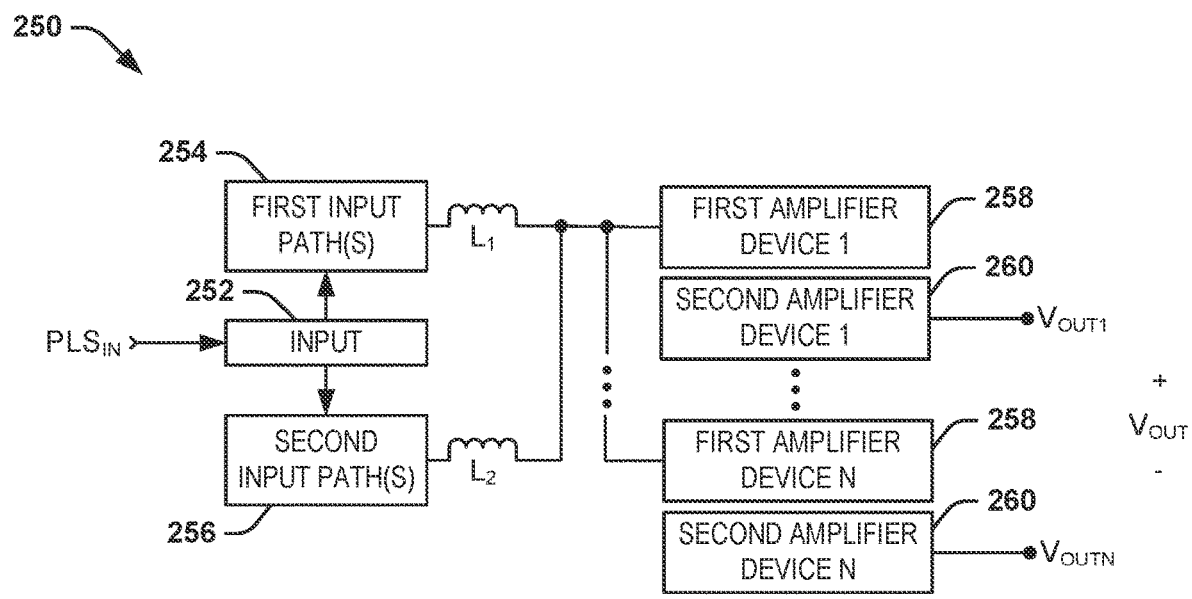
FIG. 6 illustrates another example of an NRZ amplifier circuit.

FIG. 6 illustrates another example of an NRZ amplifier system 250. The NRZ amplifier system 250 can be arranged similar to the NRZ amplifier system 10 in the example of FIG. 1 and the NRZ amplifier circuit 50 in the example of FIG. 2. However, the NRZ amplifier system 250 is demonstrated as scalable to provide a greater logic-high amplitude of the output voltage $V_{OUT}$.

The NRZ amplifier system 250 includes an input 252 that is configured to receive the input pulse $PLS_{IN}$. As an example, the input pulse $PLS_{IN}$ can be provided as a reciprocal quantum logic (RQL) input pulse that includes a positive fluxon followed by a negative fluxon, similar to as described previously. The NRZ amplifier system 250 also includes at least one first input path 254 and at least one second input path 256 that are each coupled to the input 252, and are thus configured to propagate the input pulse $PLS_{IN}$. As an example, the second input path 256 can include at least one delay element to propagate the input pulse $PLS_{IN}$ at a delay relative to the first input path 254 (e.g., by 180° relative to the first input path 252).

The NRZ amplifier system 250 also includes a plurality N of first amplifier devices 258 and a respective plurality N of second amplifier devices 260. As an example, the first and second amplifier devices 258 and 260 can be configured as superconducting quantum interference devices (SQUIDs) that are inductively coupled. The first amplifier device 258 can be coupled to the first and second input paths 254 and 256 via a respective plurality of control nodes that are coupled to the respective first and second input path(s) 254 and 256. For example, the first input path(s) 254 can be configured to provide at least one copy of the input pulse $PLS_{IN}$ to the first amplifier devices 258 and the second input path(s) 256 can be configured to provide at least one delayed copy of the input pulse $PLS_{IN}$ to the first amplifier devices 258. The quantity of the first and second input path(s) 254 and 256 can be based on the circuitry needed to split the input pulse $PLS_{IN}$ into multiple copies, such that additional JTL stages can be implemented to split the input pulse $PLS_{IN}$ into two separate pulses multiple times to accommodate the N first and second amplifier device 258 and 260 pairs.

As an example, each of the first and second amplifier device pairs 258 and 260 can operate the same concurrently. For example, the input pulse $PLS_{IN}$ provided to the first amplifier devices 258 alternately from each of the first and second input path(s) 254 and 256 can maintain the control flux in each of the first amplifier devices 258, and can thus maintain an individual output voltage, demonstrated as $V_{OUT1}$ through $V_{OUTN}$, across the respective second amplifier devices 260. As a result, the NRZ amplifier system 250 can be configured to provide the aggregate output voltage $V_{OUT}$ as a sum of the individual voltages $V_{OUT1}$ through $V_{OUTN}$. Accordingly, the NRZ amplifier system 250 can provide greater amplitudes of the logic-high amplitude of the output voltage $V_{OUT}$, based on the scalability of the first and second amplifier device pairs 258 and 260. For example, each of the individual output voltages $V_{OUT1}$ through $V_{OUTN}$ can be approximately equal to 0.5 mV at the logic-high state, thus allowing for approximately 2 mV for four first and second amplifier device pairs 258 and 260, approximately 4 mV for eight first and second amplifier device pairs 258 and 260, approximately 8 mV for sixteen first and second amplifier device pairs 258 and 260, etc.

Figure 7:
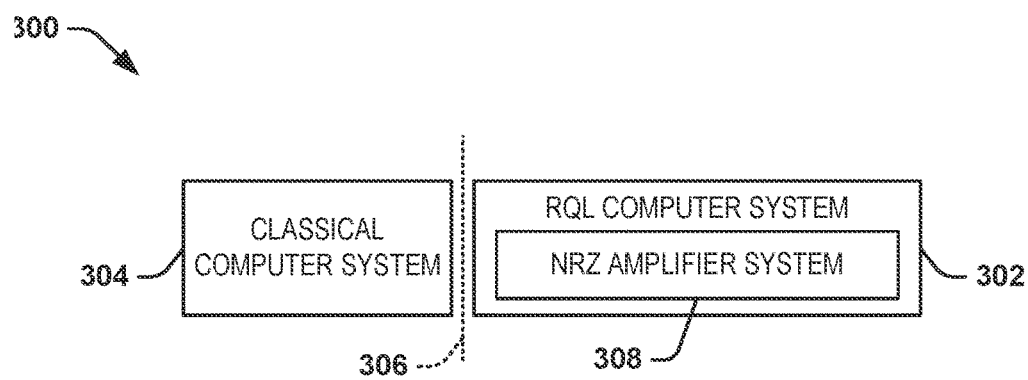
FIG. 7 illustrates an example of a computer system.

FIG. 7 illustrates an example of a computer system 300. The computer system 300 includes an RQL computer system 302 and a room temperature classical computer system 304 separated by a cold-space barrier 306. For example, the RQL computer system 302 can be configured to operate in a cold-space (e.g., at or less than 4 Kelvin), such that the cold-space barrier 306 separates the cold-space operational conditions of the RQL computer system 302 and the room-temperature operational conditions of the classical room temperature computer system 304.

In the example of FIG. 7, the RQL computer system 302 includes an NRZ amplifier system 308. The NRZ amplifier system 308 can correspond to the NRZ amplifier system 10 in the example of FIG. 1, the NRZ amplifier circuit 50 in the example of FIG. 2, or the NRZ amplifier system 250 in the example of FIG. 6. The NRZ amplifier system 308 can thus be configured to convert input pulses $PLS_{IN}$ to an output voltage $V_{OUT}$ in a non-return-to-zero manner, as described herein. For example, the input pulses $PLS_{IN}$ can be provided as an RQL input pulses including a positive fluxon followed by a negative fluxon. Therefore, the NRZ amplifier system 308 can be configured to operate as described previously regarding the examples of FIGS. 2-6 to convert the presence of the RQL input pulse corresponding to a logic-high state to a logic-high amplitude of the output voltage $V_{OUT}$, such as sustained across multiple phases of the clock signal CLK. Similarly, the NRZ amplifier system 308 can convert the absence of the RQL input pulse corresponding to a logic-low state to a logic-low amplitude (e.g., zero volts) of the output voltage $V_{OUT}$, such as sustained across multiple phases of the clock signal CLK. Accordingly, the NRZ amplifier system 308 can provide a signal transfer interface from the RQL computer system 302 to the classical computer system 304 across the cold-space barrier 306.

Figure 8:
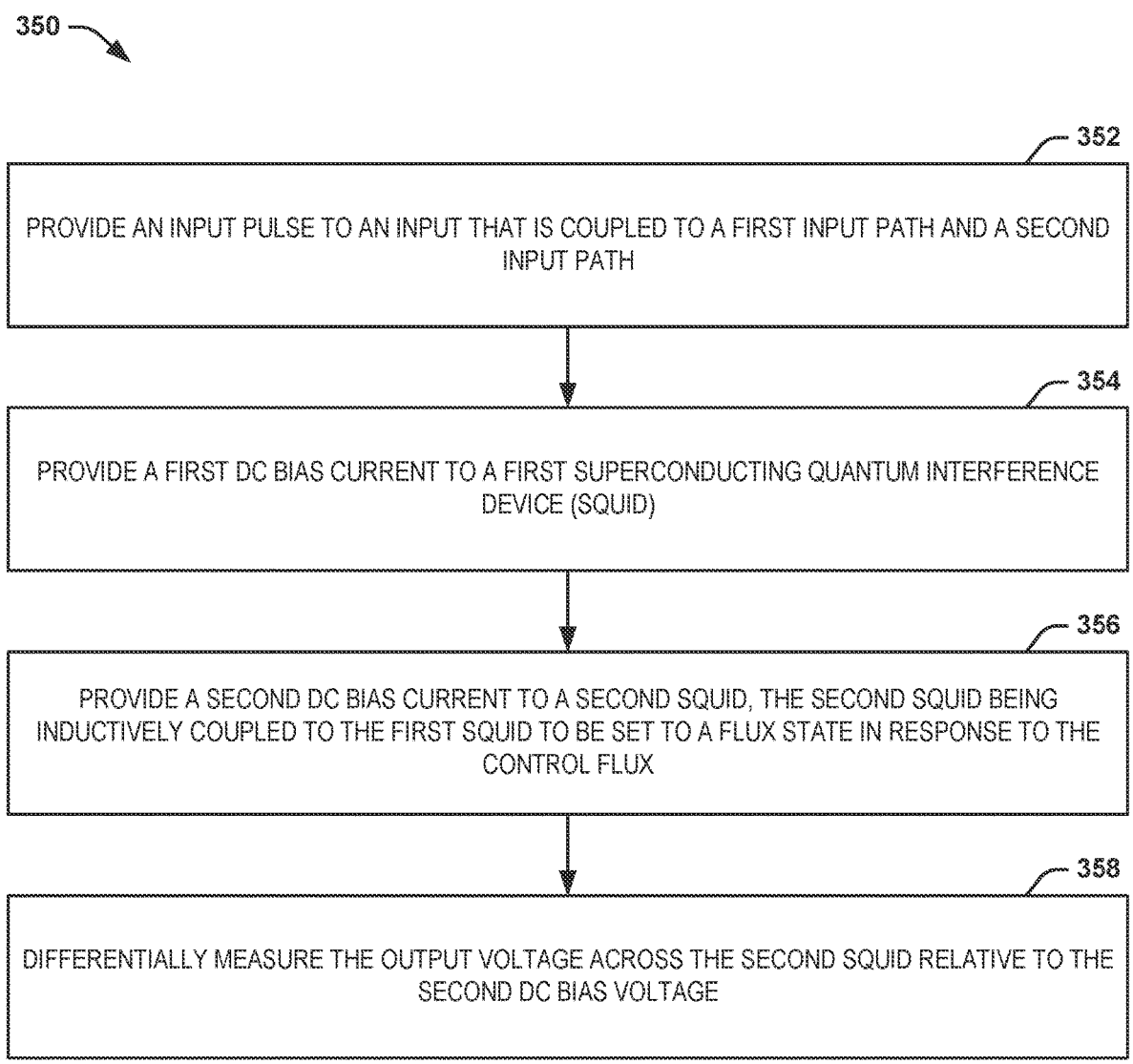
FIG. 8 illustrates an example of a method for providing an NRZ output in response to an RQL pulse.

In view of the foregoing structural and functional features described above, a methodology in accordance with various aspects of the present invention will be better appreciated with reference to FIG. 8. While, for purposes of simplicity of explanation, the methodology of FIG. 8 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 8 illustrates an example of a method 350 for providing an output voltage (e.g., the output voltage $V_{OUT}$) from an amplifier system (e.g., the NRZ amplifier system 10). At 352, an input pulse (e.g., the input pulse $PLS_{IN}$) is provided to an input (e.g., the input 12) that is coupled to a first input path (e.g., the first input path 14) and a second input path (e.g., the second input path 16). The first input path can be configured to provide the input pulse to a control node (e.g., the control node 62) and the second input path comprising at least one delay element (e.g., the JTL stages 124 and 126)) to provide a delayed version of the input pulse to the control node. At 354, a first DC bias current (e.g., the current $I_{BIAS1}$) is provided to a first superconducting quantum interference device (SQUID) (e.g., the first amplifier device 18). The first SQUID can include the control node and can be configured to provide a control flux in response to the input pulse and in response to the delayed version of the input pulse. At 356, a second DC bias current is provided to a second SQUID (e.g., the second amplifier device 20). The second SQUID can be inductively coupled to the first SQUID to be set to a flux state in response to the control flux. At 358, the output voltage is differentially measured across the second SQUID relative to the second DC bias voltage.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. An amplifier system comprising:
   an input configured to receive an input pulse;
   a first input path coupled to the input and configured to provide the input pulse to a control node, wherein the first input path comprises at least one Josephson transmission line (JTL) stage;
   a second input path coupled to the input and comprising at least one delay element to provide a delayed version of the input pulse to the control node, wherein the second input path comprises a plurality of JTL stages configured to provide a 180° phase-shift of the delayed version of the input pulse with respect to a period of a clock signal;

a first amplifier device comprising the control node and being configured to provide a control flux in response to the input pulse and in response to the delayed version of the input pulse; and a second amplifier device coupled to the first amplifier device, the second amplifier device being set to a flux state in response to the control flux to provide an output voltage.

2. The system of claim 1, wherein the input pulse is provided as a reciprocal quantum logic (RQL) input pulse comprising a positive fluxon and a negative fluxon, wherein the positive fluxon of the delayed version of the RQL input pulse is combined with the negative fluxon of the RQL input pulse at the control node to maintain the control flux associated with the first amplifier device.

3. The system of claim 2, wherein the negative fluxon of the delayed version of the RQL pulse provided without a positive fluxon associated with a next input pulse is configured to remove the control flux associated with the first amplifier device to remove the flux state associated with the second amplifier device.

4. The system of claim 2, wherein the clock signal is configured as an RQL clock signal.

5. The system of claim 1, wherein the first amplifier device is arranged as a first superconducting quantum interference device (SQUID) and the second amplifier device is arranged as a second SQUID.

6. The system of claim 5, wherein the first SQUID is arranged as an RF SQUID comprising a shunted Josephson junction that is coupled to the control node and which is configured to trigger in response to the input pulse and the delayed version of the input pulse to generate the control flux in the first SQUID.

7. The system of claim 6, wherein the input pulse is provided as a reciprocal quantum logic (RQL) input pulse comprising a positive fluxon and a negative fluxon, wherein the first SQUID is configured to maintain the control flux in response to one of the positive fluxon and the negative fluxon associated with the input pulse being combined with the other of the positive fluxon and the negative fluxon associated with the delayed version of the input pulse at the control node.

8. The system of claim 5, wherein the second SQUID is arranged as a DC SQUID, wherein the second SQUID is biased via a DC bias current, wherein the output voltage is measured as a differential voltage across the second SQUID.

9. The system of claim 5, wherein the first SQUID and the second SQUID are inductively coupled to provide the flux state in the second SQUID in response to the control flux in the first SQUID.

10. The system of claim 1, wherein the first amplifier device is one of a plurality of first amplifier devices and the second amplifier device is one of a respective plurality of second amplifier devices, wherein each of the plurality of first amplifier devices is configured to provide the control flux in response to the input pulse and in response to the delayed version of the input pulse, and wherein each of the plurality of second amplifier devices is configured to be set to the flux state in response to the control flux from a respective one of the plurality of first amplifier devices to provide a respective individual output voltage, wherein the amplifier system is configured to generate an aggregate output voltage that is a sum of the individual output voltage from each of the plurality of second amplifier devices.

11. A method for providing an output voltage from an amplifier system, the method comprising:

providing an input pulse to an input that is coupled to a first input path and a second input path, wherein the first input path being configured to provide the input pulse to a control node and comprising at least one Josephson transmission line (JTL) stage, and wherein the second input path comprises at least one delay element to provide a delayed version of the input pulse to the control node and a plurality of JTL stages configured to provide a 180° phase-shift of the delayed version of the input pulse with respect to a period of a clock signal; and providing a first DC bias current to a first superconducting quantum interference device (SQUID), the first SQUID comprising the control node and being configured to provide a control flux in response to the input pulse and in response to the delayed version of the input pulse;

providing a second DC bias current to a second SQUID, the second SQUID being inductively coupled to the first SQUID to be set to a flux state in response to the control flux; and differentially measuring the output voltage across the second SQUID.

12. The method of claim 11, wherein providing the input pulse comprises providing the input pulse as a reciprocal quantum logic (RQL) input pulse comprising a positive fluxon and a negative fluxon, wherein the positive fluxon of the delayed version of the RQL input pulse is combined with the negative fluxon of the RQL input pulse at the control node to maintain the control flux associated with the first SQUID.

13. The method of claim 12, wherein providing the input pulse further comprises providing the negative fluxon of the delayed version of the RQL pulse provided without a positive fluxon associated with a next input pulse to remove the control flux associated with the first SQUID to remove the flux state associated with the second SQUID.

14. The method of claim 11, wherein the clock signal is an RQL clock signal, and wherein providing the input pulse comprises providing the input pulse as a reciprocal quantum logic (RQL) input pulse, the method further comprising providing the RQL clock signal to control propagation of the RQL input pulse through the first input path and the second input path.

15. The method of claim 11, wherein the first SQUID is arranged as an RF SQUID comprising a shunted Josephson junction that is coupled to the control node and which is configured to trigger in response to the input pulse and the delayed version of the input pulse to generate the control flux in the first SQUID, and wherein the second SQUID is arranged as a DC SQUID, wherein the second SQUID is biased via a DC bias current, wherein the output voltage is measured as a differential voltage across the second SQUID.

16. An amplifier system comprising:

an input configured to receive a reciprocal quantum logic (RQL) input pulse comprising a positive fluxon and a negative fluxon;

a first input path coupled to the input and configured to provide the input pulse to a control node via an RQL clock signal, wherein the first input path comprises at least one Josephson transmission line (JTL) stage;

a second input path coupled to the input and comprising at least one delay element to provide a delayed version of the RQL input pulse to the control node via the RQL clock signal, wherein the second input path comprises a plurality of JTL stages configured to provide a 180° phase-shift of the delayed version of the input pulse with respect to a period of a clock signal;
a first superconducting quantum interference device (SQUID) comprising the control node and being configured to provide a control flux in response to the RQL input pulse and in response to the delayed version of the RQL input pulse; and
a second SQUID inductively coupled to the first SQUID, the second SQUID being set to a flux state in response to the control flux to provide an output voltage.

17. The system of claim 16, wherein the first SQUID is configured to maintain the control flux in response to one of the positive fluxon and the negative fluxon associated with the input pulse being combined with the other of the positive fluxon and the negative fluxon associated with the delayed version of the input pulse at the control node.

18. The system of claim 16, wherein the negative fluxon of the delayed version of the RQL pulse provided without a positive fluxon associated with a next input pulse is configured to remove the control flux associated with the first SQUID to remove the flux state associated with the second SQUID.

19. The system of claim 16, wherein the first SQUID is arranged as an RF SQUID comprising a shunted Josephson junction that is coupled to the control node and which is configured to trigger in response to the input pulse and the delayed version of the input pulse to generate the control flux in the first SQUID, and wherein the second SQUID is arranged as a DC SQUID, wherein the second SQUID is biased via a DC bias voltage, wherein the output voltage is measured as a differential voltage across the second SQUID relative to the DC bias voltage.

* * * * *